US011673794B2

United States Patent
Suzuki et al.

(10) Patent No.: US 11,673,794 B2
(45) Date of Patent: Jun. 13, 2023

(54) ACTUATOR DEVICE

(71) Applicant: HAMAMATSU PHOTONICS K.K., Hamamatsu (JP)

(72) Inventors: Daiki Suzuki, Hamamatsu (JP); Takuma Osaki, Hamamatsu (JP); Naoto Sakurai, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/950,323

(22) Filed: Sep. 22, 2022

(65) Prior Publication Data

US 2023/0013912 A1    Jan. 19, 2023

Related U.S. Application Data

(63) Continuation of application No. 16/766,996, filed as application No. PCT/JP2018/043413 on Nov. 26, 2018, now Pat. No. 11,485,629.

(30) Foreign Application Priority Data

Dec. 1, 2017  (JP) ................. 2017-232060

(51) Int. Cl.
  *H02K 33/02* (2006.01)
  *B81B 3/00* (2006.01)
  *B06B 1/04* (2006.01)

(52) U.S. Cl.
  CPC ........... *B81B 3/0021* (2013.01); *H02K 33/02* (2013.01); *B06B 1/04* (2013.01); *B81B 2201/045* (2013.01)

(58) Field of Classification Search
  CPC ........ H02K 33/02; H02K 33/00; H02K 33/04; H02K 33/06; H02K 35/00; H02K 35/02;
  (Continued)

(56) References Cited

U.S. PATENT DOCUMENTS 4,259,781 A * 4/1981 Boiten .................... B26B 19/42
                                                    30/346.51
4,260,375 A * 4/1981 Wallshein ................ A61C 7/30
                                                      433/11
(Continued)

FOREIGN PATENT DOCUMENTS

CN     206126835 U    4/2017
JP     2014-041234 A  3/2014
(Continued)

OTHER PUBLICATIONS

International Preliminary Report on Patentability dated Jun. 11, 2020 for PCT/JP2018/043413.

*Primary Examiner* — Maged M Almawri

(74) *Attorney, Agent, or Firm* — Faegre Drinker Biddle & Reath LLP

(57) ABSTRACT

An actuator device includes a support part, a first movable part, and a second movable part. The second movable part includes a pair of first connection portions positioned on both sides of the first movable part on a first axis and connected to a pair of first connecting parts, and a pair of second connection portions positioned on both sides of the first movable part on a second axis and connected to a pair of second connecting parts. An outer edge of each of the pair of the first connection portions includes a first linear portion that extends along a second axis direction. An outer edge of each of the pair of the second connection portions includes a second linear portion that extends along a first axis direction.

17 Claims, 4 Drawing Sheets

(58) Field of Classification Search
CPC ........ H02K 35/04; H02K 35/06; H02K 35/12;
H02K 35/18; B81B 3/0078; B81B
3/0045; B81B 3/0072; B81B 2203/0154;
G02B 3/0072; G02B 26/085; G02B
26/10; G02B 26/105; G02B 27/0176;
Y10T 74/10
USPC ................. 310/15, 300–309, 12.03, 40 MM;
359/196.1, 199.4, 201.2, 203.1, 197.1,
359/223.1, 224.1, 211.5
See application file for complete search history.

(56) References Cited

U.S. PATENT DOCUMENTS

| | | | | |
|---|---|---|---|---|
| 4,317,145 A * | 2/1982 | Osanai | G11B 15/1883 | 242/339 |
| 4,322,960 A * | 4/1982 | Bosch | B21D 22/16 | 72/85 |
| 4,325,527 A * | 4/1982 | Berneking | B60N 2/1685 | 248/394 |
| 4,376,240 A * | 3/1983 | Stuart | B25C 1/008 | 200/325 |
| 4,429,909 A * | 2/1984 | Lindquist | E05B 65/1066 | 292/92 |
| 4,533,803 A * | 8/1985 | Beller | H01H 23/28 | 200/290 |
| 4,557,038 A * | 12/1985 | Wcislo | H02K 15/066 | 174/DIG. 20 |
| 4,602,501 A * | 7/1986 | Hirata | G01N 11/10 | 73/54.23 |
| 4,615,109 A * | 10/1986 | Wcislo | H02K 15/066 | 174/DIG. 19 |
| 4,630,185 A * | 12/1986 | Copeland | F21V 21/28 | 362/396 |
| 4,763,967 A * | 8/1988 | Schermer | B06B 1/14 | 359/210.1 |
| 4,764,152 A * | 8/1988 | Jorg | F16F 1/373 | 464/89 |
| 4,775,870 A * | 10/1988 | Grimm | B41J 25/316 | 347/198 |
| 4,805,465 A * | 2/1989 | Gerrath | G01D 5/2451 | 73/862.328 |
| 4,886,483 A * | 12/1989 | Henderson | F16H 7/1218 | 474/135 |
| 4,887,902 A * | 12/1989 | Skinner | G01D 5/264 | 250/237 G |
| 4,908,007 A * | 3/1990 | Henderson | F16H 7/1218 | 474/135 |
| 4,913,242 A * | 4/1990 | Lo | B25B 23/141 | 81/473 |
| 4,952,197 A * | 8/1990 | Henderson | F16H 7/1218 | 474/135 |
| 4,978,326 A * | 12/1990 | Henderson | F16H 7/1218 | 474/135 |
| 5,011,122 A * | 4/1991 | Meyers | E05F 1/123 | 267/273 |
| 5,205,792 A * | 4/1993 | Quintus | F16H 7/1281 | 474/135 |
| 5,215,014 A * | 6/1993 | Burger | B41F 13/62 | 493/405 |
| 5,253,730 A * | 10/1993 | Hayashi | B62D 5/06 | 180/417 |
| 5,322,112 A * | 6/1994 | Sakata | B22D 11/05 | 164/436 |
| 5,463,438 A * | 10/1995 | Kosako | G03B 13/14 | 396/377 |
| 5,479,585 A * | 12/1995 | Komagine | B65H 5/08 | 358/1.3 |
| 5,567,109 A * | 10/1996 | Eaton | A01D 45/16 | 414/679 |
| 5,626,518 A * | 5/1997 | Maki | F16F 1/126 | 192/205 |
| 5,634,681 A * | 6/1997 | Gionta | B60P 3/14 | 296/3 |
| 5,748,394 A * | 5/1998 | Shimazaki | G02B 7/08 | 359/822 |
| 5,758,705 A * | 6/1998 | Wagner | E06B 9/581 | 160/310 |
| 5,778,928 A * | 7/1998 | Boland | F01P 11/0276 | 251/100 |
| 5,799,966 A * | 9/1998 | Haldemann | A63C 10/10 | 280/624 |
| 5,829,812 A * | 11/1998 | Gionta | B60P 3/14 | 296/3 |
| 5,875,881 A * | 3/1999 | Brink | B65G 45/16 | 198/497 |
| 5,933,066 A * | 8/1999 | Chontas | H01H 71/08 | 218/155 |
| 5,969,465 A * | 10/1999 | Neukermans | B81B 3/0078 | 310/40 MM |
| 5,999,303 A * | 12/1999 | Drake | H02N 1/008 |  |
| 6,095,318 A * | 8/2000 | Brink | B65G 45/16 | 198/499 |
| 6,098,521 A * | 8/2000 | Iida | F15B 15/082 | 92/88 |
| 6,182,929 B1 * | 2/2001 | Martin | B63B 39/06 | 244/99.11 |
| 6,188,504 B1 * | 2/2001 | Murakami | G02B 7/1821 | 359/224.1 |
| 6,227,448 B1 * | 5/2001 | Maliszewski | H04N 1/1013 | 235/455 |
| 6,232,861 B1 * | 5/2001 | Asada | B81B 3/0062 | 335/229 |
| 6,392,220 B1 * | 5/2002 | Slater | H04Q 11/0005 | 73/514.01 |
| 7,233,343 B2 * | 6/2007 | Turner | B41J 2/465 | 347/243 |
| 7,821,694 B2 * | 10/2010 | Asai | G02B 26/0858 | 359/224.1 |
| 7,872,394 B1 * | 1/2011 | Gritters | H02N 1/006 | 310/309 |
| 8,203,290 B2 * | 6/2012 | Matsubara | H02P 25/032 | 318/128 |
| 8,553,305 B2 * | 10/2013 | Nakamura | G02B 26/101 | 359/200.7 |
| 8,654,426 B2 * | 2/2014 | Yamada | G02B 26/10 | 359/212.1 |
| 8,837,029 B2 * | 9/2014 | Yamada | G02B 26/101 | 359/212.1 |
| 8,919,200 B2 * | 12/2014 | Watanabe | G01P 15/097 | 73/514.01 |
| 9,073,744 B2 * | 7/2015 | Tanaka | B81B 3/0018 |  |
| 9,291,815 B2 * | 3/2016 | Horie | G02B 26/105 |  |
| 9,470,525 B2 * | 10/2016 | Kanemoto | G01C 19/5762 |  |
| 9,470,703 B2 * | 10/2016 | Tanaka | G01P 15/0802 |  |
| 9,470,711 B2 * | 10/2016 | Tanaka | G01P 15/0802 |  |
| 9,759,908 B2 * | 9/2017 | Mizoguchi | G02B 26/101 |  |
| 10,330,923 B2 * | 6/2019 | Hino | G02B 26/085 |  |
| 10,589,985 B2 * | 3/2020 | Takimoto | G02B 26/085 |  |
| 11,199,695 B2 * | 12/2021 | Suzuki | G02B 26/085 |  |
| 2001/0022682 A1 * | 9/2001 | McClelland | G02B 26/0841 | 359/290 |
| 2002/0130561 A1 * | 9/2002 | Temesvary | G02B 6/3518 | 310/12.13 |
| 2004/0256921 A1 * | 12/2004 | Turner | H02P 25/032 | 310/36 |
| 2005/0200986 A1 * | 9/2005 | Tsuboi | G02B 26/0841 | 359/871 |
| 2005/0219674 A1 * | 10/2005 | Asai | G02B 26/0833 | 359/213.1 |
| 2006/0071578 A1 * | 4/2006 | Drabe | G01C 19/5642 | 310/309 |
| 2006/0125346 A1 * | 6/2006 | Yoda | G02B 26/0841 | 359/290 |
| 2006/0152785 A1 * | 7/2006 | Yasuda | G02B 26/105 | 359/224.1 |
| 2007/0017994 A1 * | 1/2007 | Wolter | B81B 3/007 | 235/462.37 |

(56) References Cited

U.S. PATENT DOCUMENTS

| | | | | |
|---|---|---|---|---|
| 2007/0222334 A1* | 9/2007 | Wan | .................. | H01G 5/18 361/278 |
| 2008/0054758 A1* | 3/2008 | Tsuboi | .................. | H02N 1/008 310/309 |
| 2008/0278785 A1* | 11/2008 | Klose | .................. | G02B 26/0833 359/213.1 |
| 2009/0047527 A1* | 2/2009 | Yang | .................. | B81B 3/0021 216/22 |
| 2010/0097681 A1* | 4/2010 | Klose | .................. | B81B 3/0062 318/116 |
| 2010/0259806 A1* | 10/2010 | Tauscher | .................. | H04M 1/0272 359/198.1 |
| 2011/0102870 A1* | 5/2011 | Nakamura | .................. | G02B 26/085 359/198.1 |
| 2012/0062970 A1* | 3/2012 | Yamada | .................. | G02B 7/1821 310/323.01 |
| 2012/0162739 A1* | 6/2012 | Yamada | .................. | G02B 26/0858 359/212.1 |
| 2012/0228460 A1* | 9/2012 | Suzuki | .................. | H02N 2/046 248/474 |
| 2012/0257235 A1* | 10/2012 | Hino | .................. | G02B 26/101 359/213.1 |
| 2012/0257268 A1* | 10/2012 | Hino | .................. | G02B 26/085 310/38 |
| 2012/0319528 A1* | 12/2012 | Jahnes | .................. | B81C 1/0015 29/827 |
| 2014/0340726 A1* | 11/2014 | Gu-Stoppel | .................. | G02B 26/0833 359/224.1 |
| 2015/0203346 A1* | 7/2015 | Fujimoto | .................. | B81B 3/0072 74/1 SS |
| 2015/0233965 A1* | 8/2015 | Guo | .................. | H02N 1/08 73/514.32 |
| 2015/0260751 A1* | 9/2015 | Han | .................. | G01P 15/08 73/514.33 |
| 2016/0105090 A1* | 4/2016 | Sadaharu | .................. | G02B 26/101 310/38 |
| 2017/0102538 A1* | 4/2017 | Gamet | .................. | G02B 26/101 |
| 2019/0016589 A1* | 1/2019 | Takimoto | .................. | G02B 26/085 |

FOREIGN PATENT DOCUMENTS

| | | |
|---|---|---|
| JP | 2014-056211 A | 3/2014 |
| JP | 2017-181710 A | 10/2017 |
| WO | WO-2014/162521 A1 | 10/2014 |
| WO | WO-2015/015666 A1 | 2/2015 |

\* cited by examiner

ACTUATOR DEVICE

TECHNICAL FIELD

An aspect of the disclosure relates to an actuator device formed of, for example, a Micro Electro Mechanical Systems (MEMS) device.

BACKGROUND ART

An actuator device is known as a MEMS device. The actuator device includes a support part, a first movable part, a frame-shaped second movable part that surrounds the first movable part, a pair of first connecting parts that connects the first movable part to the second movable part on a first axis, and a pair of second connecting parts that connects the second movable part to the support part on a second axis orthogonal to the first axis. In such an actuator device, the first movable part is made to swing around the first axis and the second movable part is made to swing around the second axis together with the first movable part (see, for example, Patent Literature 1).

CITATION LIST

Patent Literature

Patent Literature 1: Japanese Unexamined Patent Publication No. 2014-41234

SUMMARY OF INVENTION

Technical Problem

It is desired in the above-mentioned actuator device that the resonant frequency of the second movable part around the second axis is high to suppress the vibration of the second movable part caused by an unintended external force. On the other hand, when the first movable part swings around the first axis, the second movable part may be deformed to the side opposite to the first movable part around the first axis by a reaction against it. In this case, there is a concern that the second connecting parts need to be largely deformed to make the first movable part swing by a specified amount. Further, there is also a concern that stress may be generated at an unintended part. For this reason, it is preferable that the deformation of the second movable part around the first axis is suppressed.

An object of an aspect of the disclosure is to provide an actuator device in which a first movable part swings around a first axis and a second movable part surrounding the first movable part swings around a second axis and that can achieve both the ensuring of the resonant frequency of the second movable part around the second axis and the suppression of the deformation of the second movable part around the first axis.

Solution to Problem

An actuator device according to an aspect of the disclosure includes a support part, a first movable part, a frame-shaped second movable part that is arranged so as to surround the first movable part, a pair of first connecting parts that is arranged on both sides of the first movable part in a first axis direction parallel to a first axis and connects the first movable part to the second movable part so that the first movable part can swing around the first axis, and a pair of second connecting parts that is arranged on both sides of the second movable part in the first axis direction parallel to a second axis orthogonal to the first axis and connects the second movable part to the support part so that the second movable part can swing around the second axis. The second movable part includes a pair of first connection portions that is positioned on both sides of the first movable part on the first axis and is connected to the pair of first connecting parts, and a pair of second connection portions that is positioned on both sides of the first movable part on the second axis and is connected to the pair of second connecting parts. Each of the pair of second connection portions includes a portion having a width larger than the width of a portion of the second movable part other than the pair of first connection portions and the pair of second connection portions when viewed in a direction orthogonal to the first and second axes. An inner edge of each of the pair of second connection portions, when viewed in the direction orthogonal to the first and second axes, includes a depression portion recessed in a second axis direction, and an outer edge of each of the pair of second connection portions, when viewed in the direction orthogonal to the first and second axes, includes a protrusion portion protruding in the second axis direction.

In the actuator device, each of the pair of second connection portions positioned on both sides of the first movable part on the second axis includes a portion having a width larger than the width of a portion of the second movable part other than the pair of first connection portions and the pair of second connection portions. Accordingly, while an increase in the moment of inertia of the second movable part about the second axis is suppressed, the moment of inertia of the second movable part about the first axis can be increased. As a result, both the ensuring of the resonant frequency of the second movable part around the second axis and the suppression of the deformation of the second movable part around the first axis can be achieved. Further, the inner edge of each of the second connection portions, when viewed in the direction orthogonal to the first and second axes, includes the depression portion recessed in the second axis direction. Accordingly, the size of the second movable part can be reduced in the second axis direction, so that an increase in the moment of inertia of the second movable part about the second axis can be further suppressed. Furthermore, the outer edge of each of the second connection portions, when viewed in the direction orthogonal to the first and second axes, includes the protrusion portion protruding in the second axis direction. Accordingly, the moment of inertia of the second movable part about the first axis can be further increased. Moreover, since each of the second connection portions is positioned on the second axis, an increase in the moment of inertia of the second movable part about the second axis can be still further suppressed. Therefore, according to this actuator device, both the ensuring of the resonant frequency of the second movable part around the second axis and the suppression of the deformation of the second movable part around the first axis can be achieved in the actuator device in which the first movable part swings around the first axis and the second movable part surrounding the first movable part swings around the second axis.

In the actuator device according to the aspect of the disclosure, the second movable part may further include a pair of first linear portions that is positioned on both sides of one of the pair of second connection portions in the first axis direction and is connected to one of the pair of second connection portions, and a pair of second linear portions that is positioned on both sides of the other of the pair of second connection portions in the first axis direction and is connected to the other of the pair of second connection portions, and each of the pair of first linear portions and each of the pair of second linear portions may extend in the first axis direction. In this case, while an increase in the moment of inertia of the second movable part about the second axis is effectively suppressed, the moment of inertia of the second movable part about the first axis can be effectively increased.

In the actuator device according to the aspect of the disclosure, the second movable part may further include a pair of third linear portions that is positioned on sides opposite to one of the pair of second connection portions with respect to the pair of first linear portions and is connected to the pair of first linear portions, and a pair of fourth linear portions that is positioned on sides opposite to the other of the pair of second connection portions with respect to the pair of second linear portions and is connected to the pair of second linear portions. When viewed in a direction orthogonal to the first and second axes, one of the pair of third linear portions may extend in a direction inclined with respect to the first and second axes, the other of the pair of third linear portions may extend symmetrically to one of the pair of third linear portions with respect to the second axis, one of the pair of fourth linear portions may extend symmetrically to one of the pair of third linear portions with respect to the first axis, and the other of the pair of fourth linear portions may extend symmetrically to one of the pair of fourth linear portions with respect to the second axis. In this case, while an increase in the moment of inertia of the second movable part about the second axis is more effectively suppressed, the moment of inertia of the second movable part about the first axis can be more effectively increased.

In the actuator device according to the aspect of the disclosure, the second movable part may further include a fifth linear portion that is connected to one of the pair of first connection portions and one of the pair of second connection portions, a sixth linear portion that is connected to one of the pair of first connection portions and the other of the pair of second connection portions, a seventh linear portion that is connected to the other of the pair of first connection portions and one of the pair of second connection portions, and an eighth linear portion that is connected to the other of the pair of first connection portions and the other of the pair of second connection portions. When viewed in the direction orthogonal to the first and second axes, the fifth linear portion may extend in a direction inclined with respect to the first and second axes, the sixth linear portion may extend symmetrically to the fifth linear portion with respect to the first axis, the seventh linear portion may extend symmetrically to the fifth linear portion with respect to the second axis, and the eighth linear portion may extend symmetrically to the sixth linear portion with respect to the second axis. In this case, while an increase in the moment of inertia of the second movable part about the second axis is effectively suppressed, the moment of inertia of the second movable part about the first axis can be effectively increased.

In the actuator device according to the aspect of the disclosure, the depression portion and the protrusion portion may be positioned on the second axis when viewed in the direction orthogonal to the first and second axes. In this case, while an increase in the moment of inertia of the second movable part about the second axis is still more effectively suppressed, the moment of inertia of the second movable part about the first axis can be still more effectively increased.

The actuator device according to the aspect of the disclosure may further include a spiral coil that is provided to the second movable part so as to surround the first movable part, and a magnetic field generator that generates a magnetic field to act on the coil. In this case, both the ensuring of the resonant frequency of the second movable part around the second axis and the suppression of the deformation of the second movable part around the first axis can be achieved while an arrangement space of the coil is ensured in the second movable part.

In the actuator device according to the aspect of the disclosure, the coil may be arranged at a position that is closer to the outer edge than the inner edge of each of the pair of second connection portions on the second axis when viewed in the direction orthogonal to the first and second axes. In this case, the moment of inertia of the second movable part about the first axis can be still more effectively increased.

In the actuator device according to the aspect of the disclosure, the coil may include a portion that extends in a direction orthogonal to the magnetic field. In this case, Lorentz force, which is generated by an interaction between current flowing through the coil and a magnetic field, can be increased.

In the actuator device according to the aspect of the disclosure, the coil may be made of a metal material of which the density is higher than the density of a material of the second movable part, and may be embedded in the second movable part. In this case, the moment of inertia of the second movable part about the first axis can be still more effectively increased.

In the actuator device according to the aspect of the disclosure, each of the pair of second connection portions may include a portion having a width larger than the width of each of the pair of first connection portions. In this case, while an increase in the moment of inertia of the second movable part about the second axis is still more effectively suppressed, the moment of inertia of the second movable part about the first axis can be still more effectively increased.

In the actuator device according to the aspect of the disclosure, the depression portion may be provided over a region of each of the pair of second connection portions facing the first movable part when viewed in the direction orthogonal to the first and second axes. In this case, the moment of inertia of the second movable part about the first axis can be still more effectively increased.

In the actuator device according to the aspect of the disclosure, each of the pair of second connecting parts may extend meanderingly when viewed in the direction orthogonal to the first and second axes. In this case, the strength of each second connecting part can be improved, and the adjustment of the spring constant of each second connecting part can be facilitated. Further, an increase in the size of the device in the second axis direction can be suppressed.

Advantageous Effects of Invention

According to an aspect of the disclosure, both the ensuring of the resonant frequency of a second movable part around a second axis and the suppression of the deformation of the second movable part around a first axis can be achieved in an actuator device in which a first movable part swings around the first axis and the second movable part surrounding the first movable part swings around the second axis.

DESCRIPTION OF EMBODIMENTS

Figure 1:
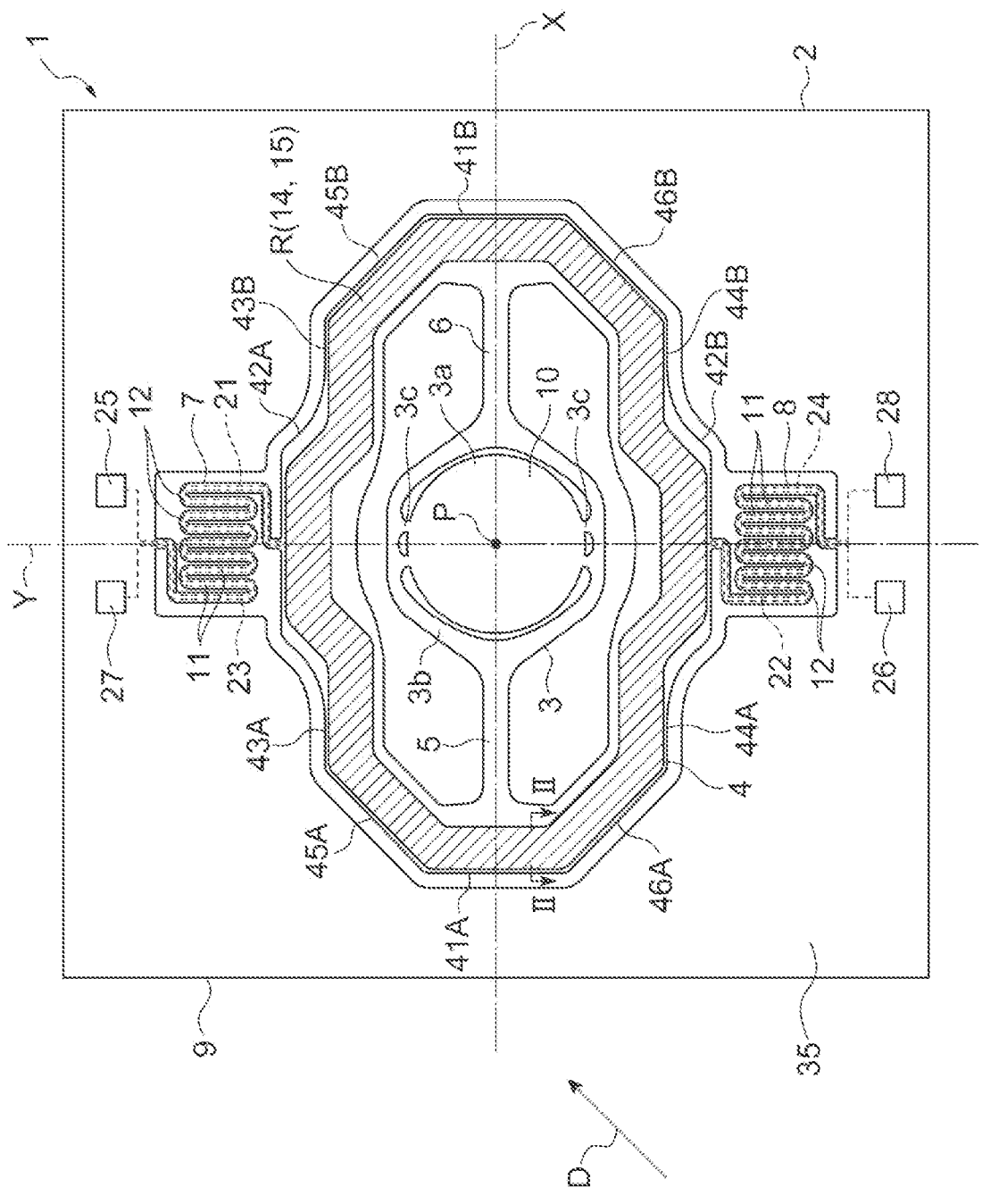
FIG. 1 is a plan view of an actuator device according to an embodiment.

An embodiment of the disclosure will be described in detail below with reference to the drawings. in the following description, the same or corresponding elements are denoted by the same reference numerals and the repeated description thereof will be omitted.

As illustrated in FIG. 1, an actuator device 1 includes a support part 2, a first movable part 3, a second movable part 4, a pair of first torsion bars (first connecting part) 5 and 6, a pair of second torsion bars (second connecting part) 7 and 8, and a magnetic field generator 9. The support part 2, the first movable part 3, the second movable part 4, the pair of first torsion bars 5 and 6, and the pair of second torsion bars 7 and 8 are integrally formed by, for example, a Silicon on Insulator (SOI) substrate. That is, the actuator device 1 is formed of a MEMS device. In the actuator device 1, the first movable part 3 provided with a mirror surface 10 is made to swing around each of an X axis (first axis) and a Y axis (second axis orthogonal to the first axis) orthogonal to each other. The actuator device 1 is used for, for example, an optical switch for optical communication, an optical scanner, and the like. The actuator device 1 is manufactured using a MEMS technology (patterning, etching, and the like).

The magnetic field generator 9 is formed of permanent magnets and the like arranged in a Halbach array. The magnetic field generator 9 generates, for example, a magnetic field in a direction D inclined with respect to each of the X axis and the Y axis by an angle of 45° in plan view (when viewed in a direction orthogonal to the X axis and the Y axis), and causes the magnetic field to act on a coil 14 to be described later. The direction D of the magnetic field generated by the magnetic field generator 9 may be inclined with respect to the X axis and the Y axis by an angle other than 45° in plan view.

The support part 2 has, for example, a rectangular outer shape in plan view and is formed in the shape of a frame. The support part 2 is arranged on one side of the magnetic field generator 9 in the direction orthogonal to the X axis and the Y axis. The first movable part 3 is arranged inside the support part 2 in a state where the first movable part 3 is spaced from the magnetic field generator 9. The first movable part 3 includes a body portion 3a, a ring shape portion 3b, and a pair of connecting portions 3c.

The body portion 3a has a circular shape in plan view, but may be formed in any shape, such as an elliptical shape, a rectangular shape, or a rhombic shape. The center P of the body portion 3a in plan view coincides with the intersection of the X axis and the Y axis. The mirror surface 10 is provided on the surface of the body portion 3a opposite to the magnetic field generator by a metal film made of, for example, aluminum. The mirror surface 10 is provided over the entire surface of the body portion, but may be provided on only a part of the surface of the body portion. The ring shape portion 3b is formed in an ring shape so as to surround the body portion 3a in plan view. The ring shape portion 3b has an octagonal outer shape in plan view, but may have an arbitrary outer shape, such as a circular shape, an elliptical shape, a rectangular shape, or a rhombic shape. The pair of connecting portions 3c is arranged on both sides of the body portion 3a on the Y axis, and connects the body portion 3a to the ring shape portion 3b.

The second movable part 4 is formed in the shape of a frame, and is arranged inside the support part 2 so as to surround the first movable part 3 in a state where the second movable part 4 is spaced from the magnetic field generator 9. The detailed configuration of the second movable part 4 will be described later.

The first torsion bars 5 and 6 are arranged on both sides of the first movable part 3 on the X axis. The first torsion bars 5 and 6 connect the first movable part 3 (ring shape portion 3b) to the second movable part 4 on the X axis so that the first movable part 3 can swing around the X axis (around the X axis as a center line). Each of the first torsion bars 5 and 6 extends linearly along the X axis. In this embodiment, for a reduction in stress acting on the first torsion bars 5 and 6, the width of an end portion of each of the first torsion bars 5 and 6 close to the first movable part 3 increases as approaching the first movable part 3, and the width of an end portion of each of the first torsion bars 5 and 6 close to the second movable part 4 increases as approaching the second movable part 4.

The second torsion bars 7 and 8 are arranged on both sides of the second movable part 4 on the Y axis. The second torsion bars 7 and 8 connect the second movable part 4 to the support part 2 on the Y axis so that the second movable part 4 can swing around the Y axis (around the Y axis as a center line). Each of the second torsion bars 7 and 8 extends meanderingly in plan view. Each of the second torsion bars 7 and 8 includes a plurality of linear portions 11 and a plurality of folded portions 12. The linear portions 11 extend in a Y-axis direction (second axis direction) parallel to the Y axis, and are arranged side by side in an X-axis direction (first axis direction) parallel to the X axis. The folded portions 12 alternately connect both ends of the adjacent linear portions 11.

The actuator device 1 further includes a pair of coils 14 and 15, a plurality of wirings 21, 22, 23, and 24, and a plurality of electrode pads 25, 26, 27, and 28. Each of the coils 14 and 15 is provided in the second movable part 4 so as to surround the first movable part 3, and has a spiral shape in plan view. Each of the coils 14 and 15 is wound around the first movable part 3 a plurality of times. The pair of coils 14 and 15 is alternately arranged side by side in the width direction of the second movable part 4 in plan view. A region R where the coils 14 and 15 are arranged is illustrated in FIG. 1 by hatching. The detail shapes and arrangement of the coils 14 and 15 in plan view will be described later.

Figure 2:
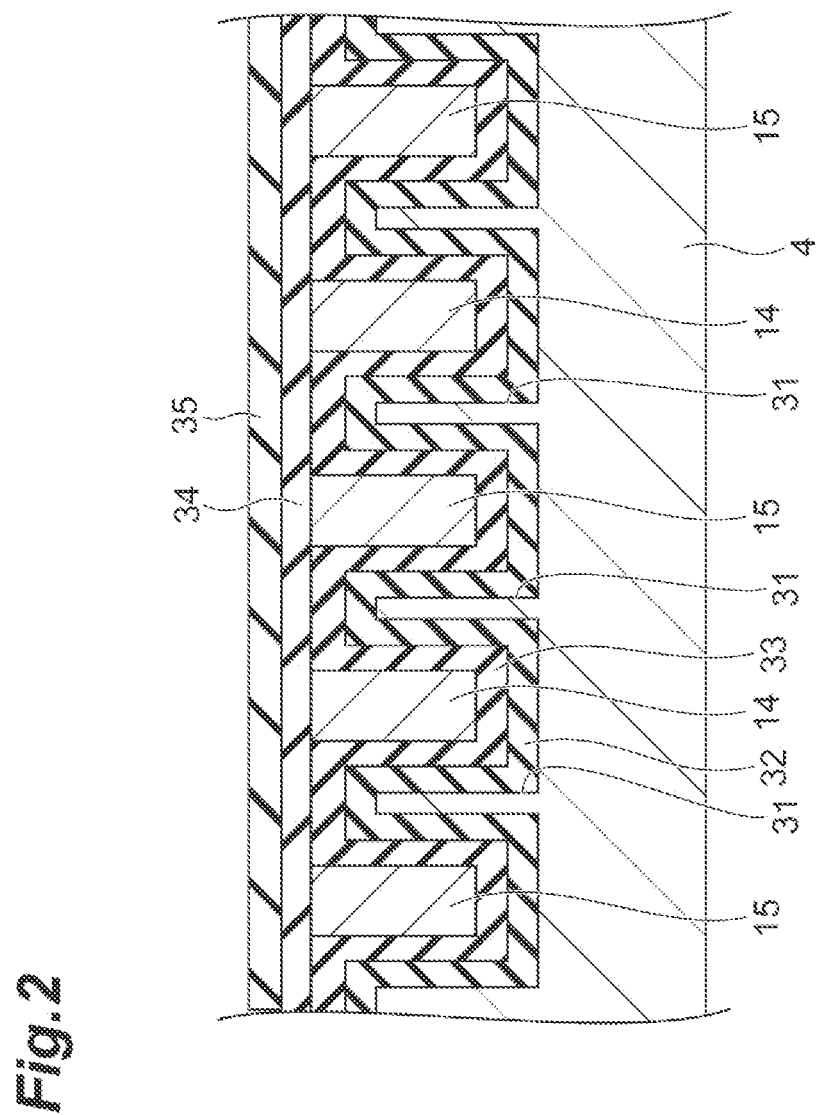
FIG. 2 is a cross-sectional view taken along line II-II illustrated in FIG. 1.

FIG. 2 is a cross-sectional view taken along line II-II illustrated in FIG. 1. As illustrated in FIG. 2, the second movable part 4 is provided with groove portions 31 having shapes corresponding to the respective coils 14 and 15. An insulating layer 32 is provided on the inner surfaces of the groove portions 31, and an insulating layer 33 is provided on the insulating layer 32. Each of the coils 14 and 15 is arranged in the groove portion 31 via the insulating layers 32 and 33. Each of the coils 14 and 15 is a damascene wiring embedded in the second movable part 4. An insulating layer 34 is provided so as to cover the coils 14 and 15 and the insulating layer 33. An insulating layer 35 is provided on the insulating layer 34. Each of the insulating layers 32 to 35 is made of, for example, silicon oxide, silicon nitride, silicon oxynitride, or the like. Each of the insulating layers 32 to 35 is integrally formed so as to cover the surfaces (surfaces opposite to the magnetic field generator 9) of the support part 2, the first movable part 3, the second movable part 4, the first torsion bars 5 and 6, and the second torsion bars 7 and 8.

Each of the coils 14 and 15 is made of a metal material of which the density is higher than the density of the material of the second movable part 4. In this embodiment, the second movable part 4 is made of silicon and each of the coils 14 and 15 is made of copper. Each of the coils 14 and 15 may be made of gold.

Each of the electrode pads 25 to 28 is provided on the support part 2, and is exposed to the outside from the insulating layer 35. The wiring 21 is electrically connected to one end of the coil 14 and the electrode pad 25. The wiring 21 extends to the electrode pad 25 from one end of the coil 14 through the second torsion bar 7. The wiring 22 is electrically connected to the other end of the coil 14 and the electrode pad 26. The wiring 22 extends to the electrode pad 26 from the other end of the coil 14 through the second torsion bar 8. Each of the wirings 21 and 22 may be a damascene wiring that is formed as with, for example, each of the coils 14 and 15, and may be a wiring arranged on the surface of the support part 2 or the like.

The wiring 23 is electrically connected to one end of the coil 15 and the electrode pad 27. The wiring 23 extends to the electrode pad 27 from one end of the coil 15 through the second torsion bar 7. The wiring 24 is electrically connected to the other end of the coil 15 and the electrode pad 28. The wiring 24 extends to the electrode pad 28 from the other end of the coil 15 through the second torsion bar 8. Each of the wirings 23 and 24 may be a damascene wiring that is formed as with, for example, each of the coils 14 and 15, and may be a wiring arranged on the surface of the support part 2 or the like.

In the actuator device 1 having the above-mentioned configuration, when a drive signal for a linear operation is input to the coil 14 through the electrode pads 25 and 26 and the wirings 21 and 22, Lorentz force acts on the coil 14 due to an interaction between the drive signal and the magnetic field generated by the magnetic field generator 9. The mirror surface 10 (first movable part 3) can be linearly operated around the Y axis together with the second movable part 4 using a balance between the Lorentz force and the elastic forces of the second torsion bars 7 and 8.

On the other hand, when a drive signal for a resonant operation is input to the coil 15 through the electrode pads 27 and 28 and the wirings 23 and 24, Lorentz force acts on the coil 15 due to an interaction between the drive signal and the magnetic field generated by the magnetic field generator 9. The mirror surface 10 (first movable part 3) can be operated to resonate around the X axis using the resonance of the first movable part 3 at a resonant frequency in addition to the Lorentz force. Specifically, when a drive signal having a frequency equal to the resonant frequency of the first movable part 3 around the X axis is input to the coil 15, the second movable part 4 slightly vibrates around the X axis at this frequency. This vibration is transmitted to the first movable part 3 through the first torsion bars 5 and 6, so that the first movable part 3 can swing around the X axis at this frequency.

Subsequently, the detailed configuration of the second movable part 4 will be described. As illustrated in FIG. 1, the second movable part 4 includes a pair of first connection portions 41A and 41B, a pair of second connection portions 42A and 42B, a pair of first linear portions 43A and 43B, a pair of second linear portions 44A and 44B, a pair of third linear portions 45A and 45B, and a pair of fourth linear portions 46A and 46B. The second movable part 4 has a shape symmetrical with respect to each of the X axis and the Y axis in plan view. In the following description, symmetry with respect to the X axis or the Y axis means symmetry in plan view.

The first connection portions 41A and 41B are positioned on both sides of the first movable part 3 on the X axis. Each of the first connection portions 41A and 41B includes a portion facing the first movable part 3 in the X-axis direction in plan view. Each of the first connection portions 41A and 41B extends in the Y-axis direction. The first connection portions 41A and 41B are connected to the first torsion bars 5 and 6. That is, the first torsion bars 5 and 6 are connected to the second movable part 4 at the first connection portions 41A and 41B.

The second connection portions 42A and 42B are positioned on both sides of the first movable part 3 on the Y axis. Each of the second connection portions 42A and 42B includes a portion facing the first movable part 3 in the Y-axis direction in plan view. Each of the second connection portions 42A and 42B extends in the X-axis direction. The second connection portions 42A and 42B are connected to the second torsion bars 7 and 8. That is, the second torsion bars 7 and 8 are connected to the second movable part 4 at the second connection portions 42A and 42B.

The first linear portions 43A and 43B are positioned on both sides of the second connection portion 42A in the X-axis direction, and are connected to the second connection portion 42A. Each of the first linear portions 43A and 43B extends in the X-axis direction. The first linear portions 43A and 43B are arranged symmetrically to each other with respect to the Y axis. The second linear portions 44A and 44B are positioned on both sides of the second connection portion 42B in the X-axis direction, and are connected to the second connection portion 42B. Each of the second linear portions 44A and 44B extends in the X-axis direction. The second linear portions 44A and 44B are arranged symmetrically to each other with respect to the Y axis.

The third linear portions 45A and 45B are positioned on the sides opposite to the second connection portion 42A with respect to the first linear portions 43A and 43B, and are connected to the first linear portions 43A and 43B and the first connection portions 41A and 41B. The third linear portion 45A extends in a direction inclined with respect to each of the X axis and the Y axis by an angle of 45° in plan view. The third linear portion 45B extends symmetrically to the third linear portion 45A with respect to the Y axis. A direction in which the third linear portion 45A extends may be inclined with respect to the X axis and the Y axis by an angle other than 45°.

The fourth linear portions 46A and 46B are positioned on the sides opposite to the second connection portion 42B with respect to second linear portions 44A and 44B, and are connected to the second linear portions 44A and 44B and the first connection portions 41A and 41B. The fourth linear portion 46A extends symmetrically to the third linear portion 45A with respect to the X axis. The fourth linear portion 46B extends symmetrically to the fourth linear portion 46A with respect to the Y axis, and extends symmetrically to the third linear portion 45B with respect to the X axis.

The configuration of the second connection portion 42A will be described in more detail with reference to FIG. 3. The second connection portion 42A will be described below. However, the second connection portion 42B is configured symmetrically to the second connection portion 42A with respect to the X axis, and has the same configuration as the second connection portion 42A. An inner edge 51 of the second connection portion 42A in plan view includes one depression portion 52 recessed in the Y-axis direction. The depression portion 52 is recessed from the inner edge of each of the first linear portions 43A and 43B toward the side opposite to the first movable part 3. The depression portion 52 is positioned on the Y axis in plan view. The depression portion 52 is provided over a region of the second connection portion 42A facing the first movable part 3 in plan view. The inner edge 51 of the region where the depression portion 52 is formed is curved so as to go away from the first movable part 3 as approaching the Y axis. The inner edge 51 of a region where the depression portion 52 is not formed extends in the X-axis direction. The curvature of the inner edge 51 is continuous at a boundary between the region where the depression portion 52 is formed and the region where the depression portion 52 is not formed.

An outer edge 53 of the second connection portion 42A in plan view includes one protrusion portion 54 protruding in the Y-axis direction. The protrusion portion 54 protrudes from the outer edge of each of the first linear portions 43A and 43B toward the side opposite to the first movable part 3. The protrusion portion 54 is positioned on the Y axis in plan view. The protrusion portion 54 is provided over a region of the second connection portion 42A facing the first movable part 3 in plan view. The protrusion portion 54 does not have a shape corresponding to the depression portion 52. That is, the outer edge 53 includes a portion formed not along the inner edge 51. The outer edge 53 of a region where the protrusion portion 54 is formed includes a linear portion 53a and a pair of curved portions 53b. The linear portion 53a extends in the X-axis direction, and crosses the Y axis in plan view. Each curved portion 53b has a curved shape so as to be recessed inward, and is connected to the linear portion 53a. The curvature of the outer edge 53 is continuous at a boundary between the linear portion 53a and each curved portion 53b. The pair of curved portions 53b is connected to the outer edges of the first linear portions 43A and 43B so that the curvature is continuous at the boundary.

The second connection portion 42A includes a portion (widened portion) having a width larger than the width of a portion of the second movable part 4 other than the first connection portions 41A and 41B and the second connection portions 42A and 42B in plan view. In this embodiment, the widths of the respective linear portions 43A to 46B are equal to each other. Accordingly, the width (maximum width) W1 of the portion of the second movable part 4 other than the first connection portions 41A and 41B and the second connection portions 42A and 42B is the width of each of the linear portions 43A to 46B. The width of the second connection portion 42A is the minimum width W2 on the Y axis. The minimum width W2 is larger than the width W1. Accordingly, the entire second connection portion 42A has a width larger than the width W1 in this embodiment.

Further, the minimum width W2 of the second connection portion 42A is larger than the width (maximum width) W3 of each of the first connection portions 41A and 41B. The width W3 of each of the first connection portions 41A and 41B is larger than the above-mentioned width W1, but may be equal to the width W1 or may be smaller than the width W1. A boundary between the first connection portion 41A and the first torsion bar 5 is illustrated in FIG. 3 by a one-dot chain line B. The width of a certain portion of the second movable part 4 is a distance between the inner edge and the outer edge of this portion in plan view, that is, is the width of this portion in a direction (width direction) orthogonal to a direction orthogonal to the X axis and the Y axis and a direction orthogonal to the extending direction of this portion. For example, the width of the first connection portion 41A is the width of the first connection portion 41A in the X-axis direction, and the width of the second connection portion 42A is the width of the second connection portion 42A in the Y-axis direction.

Subsequently, the detail shapes and arrangement of the coils 14 and 15 in plan view will be described. As illustrated in FIGS. 1 and 3, each of the coils 14 and 15 extends in the extending directions of the first connection portions 41A and 41B and the respective linear portions 43A to 46B at the first connection portions 41A and 41B and the respective linear portions 43A to 46B. Each of the coils 14 and 15 provided at the third and fourth linear portions 45B and 46A extends in a direction orthogonal to the magnetic field generated by the magnetic field generator 9. At the first connection portions 41A and 41B and the respective linear portions 43A to 46B, the outer edge of the region R where the coils 14 and 15 are arranged extends along the outer edges of the first connection portions 41A and 41B and the respective linear portions 43A to 46B and the inner edge of the region R extends along the inner edges of the first connection portions 41A and 41B and the respective linear portions 43A to 46B.

Figure 3:
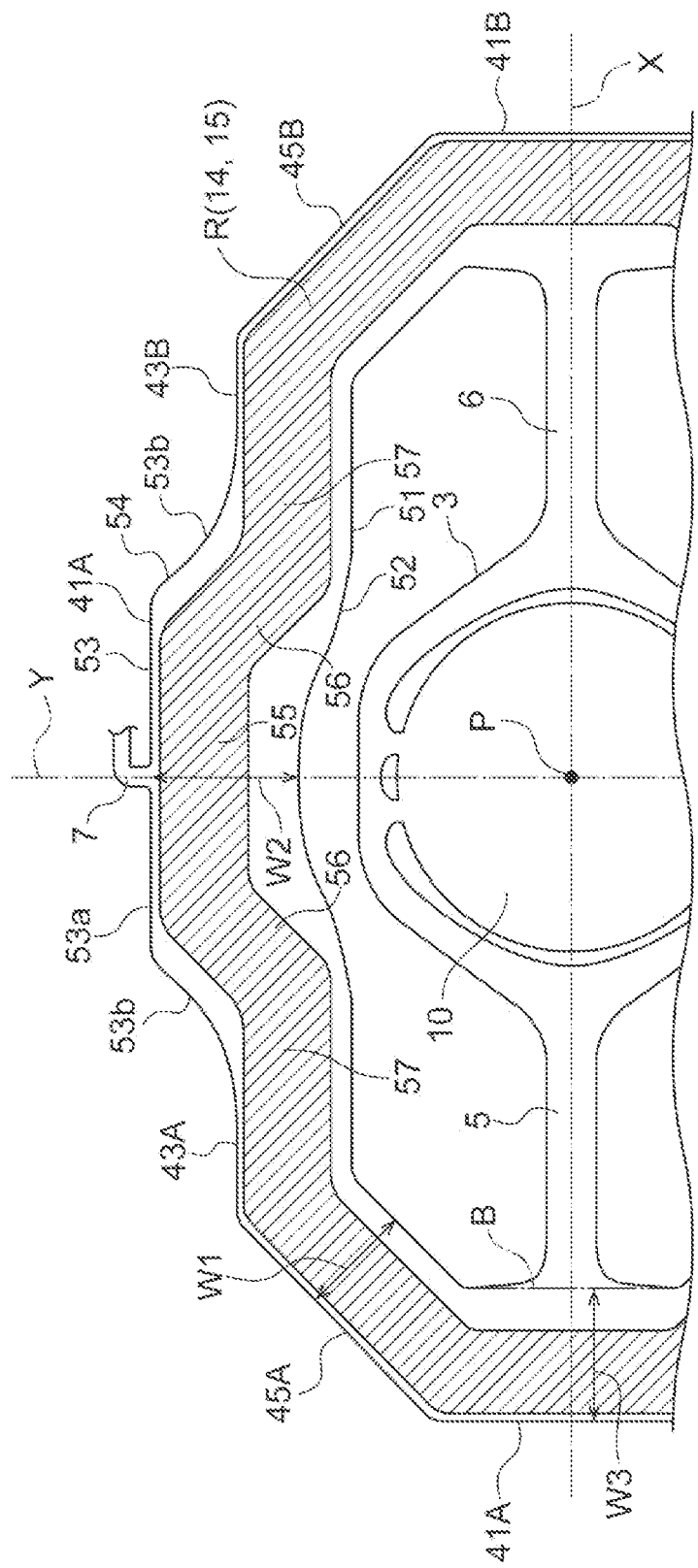
FIG. 3 is an enlarged plan view of a part of FIG. 1.

As illustrated in FIG. 3, the region R in the second connection portion 42A includes a first portion 55, a pair of second portions 56, and a pair of third portions 57. The first portion 55 extends in the X-axis direction, and crosses the Y axis in plan view. The pair of second portions 56 is positioned on both sides of the first portion 55 in the X-axis direction, and is connected to the first portion 55. One second portion 56 extends in the direction inclined with respect to each of the X axis and the Y axis by an angle of 45°. The other second portion 56 extends symmetrically to one second portion 56 with respect to the Y axis. Each of the coils 14 and 15 provided in the other second portion 56 extends in the direction orthogonal to the magnetic field generated by the magnetic field generator 9. The first portion 55 is arranged at a position closer to the outer edge 53 than the inner edge 51 of the second connection portion 42A. That is, a distance between the first portion 55 and the inner edge 51 is longer than a distance between the first portion 55 and the outer edge 53. The pair of third portions 57 is positioned on the sides opposite to the first portion 55 with respect to the second portions 56, and is connected to the pair of second portions 56 and the region R of the first linear portions 43A and 43B. Each third portion 57 extends in the X-axis direction. A direction where one second portion 56 extends may be inclined with respect to the X axis and the Y axis by an angle other than 45°.

As described above, in the actuator device 1, each of the pair of second connection portions 42A and 42B positioned on both sides of the first movable part 3 on the Y axis includes a portion having a width larger than the width of a portion of the second movable part 4 other than the first connection portions 41A and 41B and the second connection portions 42A and 42B. Accordingly, while an increase in the moment of inertia of the second movable part 4 about the Y axis is suppressed, the moment of inertia of the second movable part 4 about the X axis can be increased. That is, the resonant frequency of the second movable part 4 around the Y axis is larger as the moment of inertia of the second movable part 4 about the Y axis is smaller. It is more difficult for the second movable part 4 to be deformed around the X axis as the moment of inertia of the second movable part 4 about the X axis is larger. Accordingly, both the ensuring of the resonant frequency of the second movable part 4 around the Y axis and the suppression of the deformation of the second movable part 4 around the X axis can be achieved in the actuator device 1.

Further, in the actuator device 1, the inner edge 51 of each of the second connection portions 42A and 42B in plan view includes the depression portion 52 recessed in the Y-axis direction. Accordingly, the size of the second movable part 4 can be reduced in the Y-axis direction, so that an increase in the moment of inertia of the second movable part 4 about the Y axis can be further suppressed. Furthermore, the outer edge 53 of each of the second connection portions 42A and 42B in plan view includes the protrusion portion 54 protruding in the Y-axis direction. Accordingly, the moment of inertia of the second movable part 4 about the X axis can be further increased. Moreover, since each of the second connection portions 42A and 42B is positioned on the Y axis, an increase in the moment of inertia of the second movable part 4 about the Y axis can be still further suppressed. Therefore, according to the actuator device 1, both the ensuring of the resonant frequency of the second movable part 4 around the Y axis and the suppression of the deformation of the second movable part 4 around the X axis can be achieved in the actuator device 1 in which the first movable part 3 swings around the X axis and the second movable part 4 surrounding the first movable part 3 swings around the Y axis. For example, according to the actuator device 1, the moment of inertia of the second movable part 4 about the X axis can be effectively increased in comparison with a case where the outer shape of the second movable part 4 in plan view is a substantially rhombic shape.

In the actuator device 1, the second movable part 4 further includes the first linear portions 43A and 43B and the second linear portions 44A and 44B. Accordingly, while an increase in the moment of inertia of the second movable part 4 about the Y axis is effectively suppressed, the moment of inertia of the second movable part 4 about the X axis can be effectively increased.

In the actuator device 1, the second movable part 4 further includes the third linear portions 45A and 45B and the fourth linear portions 46A and 46B. Accordingly, the length of a portion of the second movable part 4 extending in the Y-axis direction can be shortened. As a result, while an increase in the moment of inertia of the second movable part 4 about the Y axis is more effectively suppressed, the moment of inertia of the second movable part 4 about the X axis can be more effectively increased.

In the actuator device 1, the depression portions 52 and the protrusion portions 54 are positioned on the Y axis in plan view. Accordingly, while an increase in the moment of inertia of the second movable part 4 about the Y axis is still more effectively suppressed, the moment of inertia of the second movable part 4 about the X axis can be still more effectively increased.

The actuator device 1 includes the coils 14 and 15 and the magnetic field generator 9. Accordingly, both the ensuring of the resonant frequency of the second movable part 4 around the Y axis and the suppression of the deformation of the second movable part 4 around the X axis can be achieved while an arrangement space of the coils 14 and 15 is ensured in the second movable part 4.

In the actuator device 1, each of the coils 14 and 15 is arranged at a position that is closer to the outer edge 53 than the inner edge 51 of each of the second connection portions 42A and 42B. Accordingly, the moment of inertia of the second movable part 4 about the X axis can be still more effectively increased.

In the actuator device 1, each of the coils 14 and 15 includes a portion extending in the direction orthogonal to the magnetic field. Accordingly, Lorentz force, which is generated by an interaction between current flowing through the coils 14 and 15 and a magnetic field, can be increased.

In the actuator device 1, each of the coils 14 and 15 is made of a metal material of which the density is higher than the density of the material of the second movable part 4 and is embedded in the second movable part 4. Accordingly, the moment of inertia of the second movable part 4 about the X axis can be still more effectively increased.

In the actuator device 1, each of the second connection portions 42A and 42B includes a portion having a width larger than the width of each of the first connection portions 41A and 41B. Accordingly, while an increase in the moment of inertia of the second movable part 4 about the Y axis is still more effectively suppressed, the moment of inertia of the second movable part 4 about the X axis can be still more effectively increased.

In the actuator device 1, the depression portion 52 is provided over a region of each of the second connection portions 42A and 42B facing the first movable part 3 in plan view. Accordingly, the moment of inertia of the second movable part 4 about the X axis can be still more effectively increased. Further, a space where the first movable part 3 swings can be suitably ensured.

In the actuator device 1, each of the second torsion bars 7 and 8 extends meanderingly in plan view. Accordingly, the strength of each of the second torsion bars 7 and 8 can be improved, and the adjustment of the spring constants of the second torsion bars 7 and 8 can be facilitated. Further, even though the length of the second movable part 4 in the Y-axis direction is increased due to the protrusion portions 54, an increase in the size of the device in the Y-axis direction can be suppressed.

Figure 4:
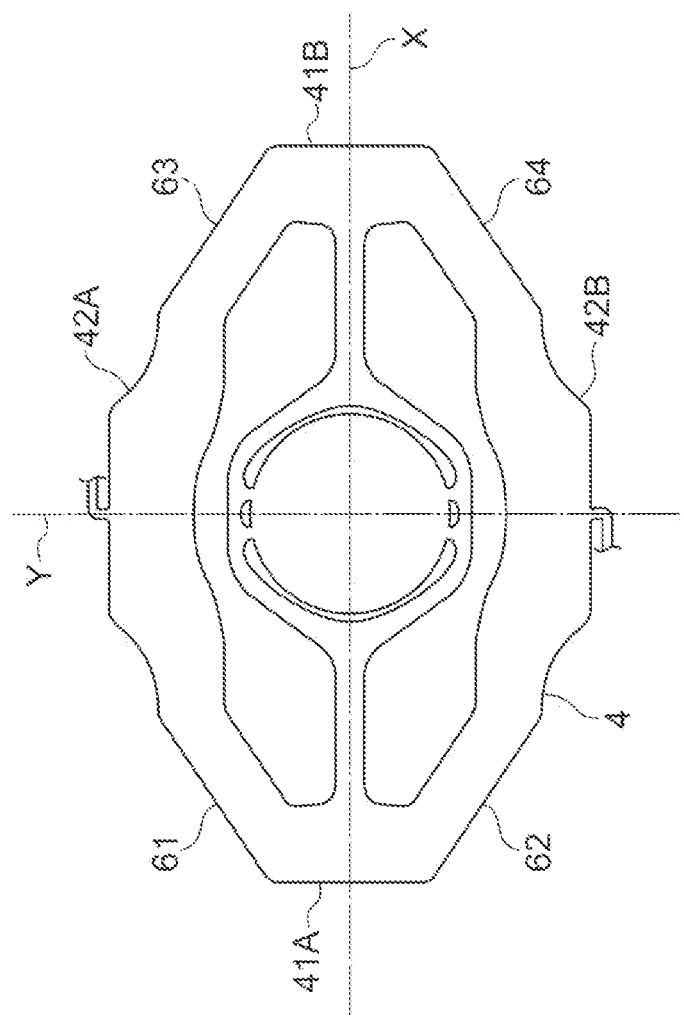
FIG. 4 is a plan view illustrating a modification.

One embodiment of the disclosure has been described above, but the disclosure is not limited to the embodiment. The second movable part 4 may be adapted as in a modification illustrated in, for example, FIG. 4. In this modification, the second movable part 4 includes a fifth linear portion 61, a sixth linear portion 62, a seventh linear portion 63, and an eighth linear portion 64. The fifth linear portion 61 is connected to the first connection portion 41A and the second connection portion 42A. The sixth linear portion 62 is connected to the first connection portion 41A and the second connection portion 42B. The seventh linear portion 63 is connected to the first connection portion 41B and the second connection portion 42A. The eighth linear portion 64 is connected to the first connection portion 41B and the second connection portion 42B. The fifth linear portion 61 extends in a direction inclined with respect to the X axis and the Y axis in plan view. The sixth linear portion 62 extends symmetrically to the fifth linear portion 61 with respect to the X axis. The seventh linear portion 63 extends symmetrically to the fifth linear portion 61 with respect to the Y axis. The eighth linear portion 64 extends symmetrically to the sixth linear portion 62 with respect to the Y axis. The eighth linear portion 64 extends symmetrically to the seventh linear portion 63 with respect to the X axis. Even in this modification, as in the embodiment, both the ensuring of the resonant frequency of the second movable part 4 around the Y axis and the suppression of the deformation of the second movable part 4 around the X axis can be achieved. Further, since the second movable part 4 includes the linear portions 61 to 64, the moment of inertia of the second movable part 4 about the X axis can be effectively increased while an increase in the moment of inertia of the second movable part 4 about the Y axis is effectively suppressed.

The first movable part 3 is driven by an electromagnetic force in the embodiment, but the first movable part 3 may be driven by a piezoelectric element. In this case, for example, the second movable part 4 is provided with a first piezoelectric film that causes the first movable part 3 to swing around the X axis, instead of the coils 14 and 15. The first piezoelectric film is arranged on, for example, the second connection portions 42A and 42B, the first linear portions 43A and 43B, and the second linear portions 44A and 44B. Further, each of the second torsion bars 7 and 8 is provided with a second piezoelectric film that causes the second movable part 4 to swing around the Y axis. The magnetic field generator 9 will be omitted.

The first and second movable parts 3 and 4 are linearly operated around the Y axis in the embodiment, but the first and second movable parts 3 and 4 may be operated to resonate around the Y axis. The second movable part 4 is provided with the pair of coils 14 and 15 in the embodiment, but the second movable part 4 may be provided with only one coil. Even in this case, the first movable part can swing around the X axis and the second movable part 4 can swing around the Y axis by the input of a drive signal to the coil. Alternatively, the first movable part 3 may be provided with one coil that causes the first movable part 3 to swing around the X axis, and the second movable part 4 may be provided with one coil that causes the second movable part 4 to swing around the Y axis. In the embodiment, the second movable part 4 may be provided with an electromotive force-monitoring coil for measuring an electromotive force and the support part 2 may be provided with a temperature sensor coil for measuring a temperature. The respective coils 14 and 15 may be arranged on the second movable part 4 without being embedded in the second movable part 4.

The material and shape of each component are not limited to the above-mentioned material and shape, and various materials and shapes can be employed. The outer edge 53 of each of the second connection portions 42A and 42B may include a plurality of protrusion portions protruding in the Y-axis direction. For example, the outer edge 53 may include a pair of protrusion portions arranged symmetrically to each other with respect to the Y axis. In this case, the outer edge 53 between the two protrusion portions extends linearly in the X-axis direction, and the second torsion bars 7 and 8 may be connected to this linear portion. In this case, the protrusion portions are not positioned on the Y axis in plan view. Likewise, the inner edge 51 of each of the second connection portions 42A and 42B may include a plurality of depression portions recessed in the Y-axis direction, and the depression portions may not be positioned on the Y axis in plan view. The shape of each of the depression portion 52 and the protrusion portion 54 in plan view may be an arbitrary shape, such as a rectangular shape, a semicircular shape, or a semi-elliptical shape. The protrusion portion 54 may be provided with a slit or a depression portion.

Each of the second connection portions 42A and 42B has only to include a portion having a width larger than the width W1 of a portion of the second movable part 4 other than the first connection portions 41A and 41B and the second connection portions 42A and 42B, and may include a portion having a width equal to the width W1 or a width smaller than the width W1. Each of the second connection portions 42A and 42B may not include a portion having a width larger than the width W3 of each of the first connection portions 41A and 41B.

The shape of the second movable part 4 is not limited to the above-mentioned example. For example, the third linear portions 45A and 45B and the fourth linear portions 46A and 46B may not be provided, and the first linear portions 43A and 43B and the second linear portions 44A and 44B may be directly connected to the first connection portions 41A and 41B. Alternatively, the first linear portions 43A and 43B and the second linear portions 44A and 44B may not be provided, and third linear portions 45A and 45B and the fourth linear portions 46A and 46B may be directly connected to the second connection portions 42A and 42B. The second movable part 4 may have a substantially circular shape, a substantially elliptical shape, a substantially rectangular shape, or the like in plan view. The ring shape portion 3b may not be provided, and the first torsion bars 5 and 6 may be directly connected to the body portion 3a. The first torsion bars 5 and 6 have only to be arranged on both sides of the first movable part 3 in the X-axis direction, and may connect the first movable part 3 to the second movable part 4 at positions other than the positions on the X axis. The second torsion bars 7 and 8 have only to be arranged on both sides of the second movable part 4 in the Y-axis direction, and may connect the second movable part 4 to the support part 2 at positions other than the positions on the Y axis. The second torsion bars 7 and 8 may extend linearly in plan view. The actuator device 1 may be a device to drive a portion other than the mirror surface 10. Each of the linear portions 43A to 46B has only to extend in a certain direction, the inner edge of at least one of the linear portions 43A to 46B in plan view may include a depression portion or a protrusion portion, and the outer edge of at least one of the linear portions 43A to 46B in plan view may include a depression portion or a protrusion portion.

REFERENCE SIGNS LIST

1: actuator device, 2: support part, 3: first movable part, 4: second movable part, 5, 6: first torsion bar (first connecting part), 7, 8: second torsion bar (second connecting part), 9: magnetic field generator, 14, 15: coil, 41A, 41B: first connection portion, 42A, 42B: second connection portion, 43A, 43B: first linear portion, 44A, 44B: second linear portion, 45A, 45B: third linear portion, 46A, 46B: fourth linear portion, 51: inner edge, 52: depression portion, 53: outer edge, 54: protrusion portion.

The invention claimed is:

1. An actuator device comprising:
a support part;
a first movable part;
a second movable part formed in a frame shape and arranged so as to surround the first movable part, wherein a coil is provided to the second movable part;
a pair of first connecting parts arranged on both sides of the first movable part in a first axis direction parallel to a first axis and connecting the first movable part to the second movable part so that the first movable part can swing around the first axis; and
a pair of second connecting parts arranged on both sides of the second movable part in a second axis direction parallel to a second axis orthogonal to the first axis and connecting the second movable part to the support part so that the second movable part can swing around the second axis,
wherein the second movable part includes a pair of first connection portions positioned on both sides of the first movable part on the first axis and connected to the pair of first connecting parts, and a pair of second connection portions positioned on both sides of the first movable part on the second axis and connected to the pair of second connecting parts, an outer edge of each of the pair of the first connection portions includes a first linear portion that extends along the second axis direction, an outer edge of each of the pair of the second connection portions includes a second linear portion that extends along the first axis direction, and a width of each of the pair of the second connection portions is larger than a width of each of the pair of the first connection portions when viewed in a direction orthogonal to the first and second axes.

2. The actuator device according to claim 1,
wherein the second movable part further includes a fifth linear portion connected to one of the pair of first connection portions and one of the pair of second connection portions, a sixth linear portion connected to the one of the pair of first connection portions and the other of the pair of second connection portions, a seventh linear portion connected to the other of the pair of first connection portions and the one of the pair of second connection portions, and an eighth linear portion connected to the other of the pair of first connection portions and the other of the pair of second connection portions, and when viewed in the direction orthogonal to the first and second axes, the fifth linear portion extends in a direction inclined with respect to the first and second axes, the sixth linear portion extends symmetrically to the fifth linear portion with respect to the first axis, the seventh linear portion extends symmetrically to the fifth linear portion with respect to the second axis, and the eighth linear portion extends symmetrically to the sixth linear portion with respect to the second axis.

3. The actuator device according to claim 1, further comprising:
a magnetic field generator that generates a magnetic field to act on the coil,
wherein the coil has a spiral shape and surrounds the first movable part when viewed in the direction orthogonal to the first and second axes.

4. The actuator device according to claim 1,
wherein the coil is arranged at a position closer to the outer edge than the inner edge of each of the pair of second connection portions on the second axis when viewed in the direction orthogonal to the first and second axes.

5. The actuator device according to claim 1,
wherein the coil includes a portion extending in a direction orthogonal to the magnetic field.

6. The actuator device according to claim 1,
wherein the coil is made of a metal material of which the density is higher than the density of a material of the second movable part, and is embedded in the second movable part.

7. The actuator device according to claim 1,
wherein each of the pair of second connecting parts extends meanderingly when viewed in the direction orthogonal to the first and second axes.

8. The actuator device according to claim 1,
wherein the width of each of the pair of the second connection portions is larger than a width of each of the pair of the third connection portions.

9. The actuator device according to claim 1,
wherein the second movable part has a shape elongated in the first axis direction when viewed in the direction orthogonal to the first and second axes.

10. The actuator device according to claim 1,
wherein a width of an end portion of each of the pair of first connecting parts on a side of one of the pair of first connection portions increases as approaching the one of the pair of first connection portions when viewed in the direction orthogonal to the first and second axes.

11. The actuator device according to claim 1,
wherein a width of an end portion of each of the pair of first connecting parts on a side of the first movable part increases as approaching the first movable part when viewed in the direction orthogonal to the first and second axes.

12. The actuator device according to claim 1,
wherein the second movable part further includes a pair of first linear portions positioned on both sides of one of the pair of second connection portions in the first axis direction and connected to the one of the pair of second connection portions, and a pair of second linear portions positioned on both sides of the other of the pair of second connection portions in the first axis direction and connected to the other of the pair of second connection portions, and each of the pair of first linear portions and each of the pair of second linear portions extend in the first axis direction.

13. The actuator device according to claim 12,
wherein the second movable part further includes a pair of third linear portions positioned on sides opposite to the one of the pair of second connection portions with respect to the pair of first linear portions and connected to the pair of first linear portions, and a pair of fourth linear portions positioned on sides opposite to the other of the pair of second connection portions with respect to the pair of second linear portions and connected to the pair of second linear portions, and when viewed in the direction orthogonal to the first and second axes, one of the pair of third linear portions extends in a direction inclined with respect to the first and second axes, the other of the pair of third linear portions extends symmetrically to the one of the pair of third linear portions with respect to the second axis, one of the pair of fourth linear portions extends symmetrically to the one of the pair of third linear portions with respect to the first axis, and the other of the pair of fourth linear portions extends symmetrically to the one of the pair of fourth linear portions with respect to the second axis.

14. The actuator device according to claim 1,
wherein the second movable part further includes a pair of third connection portions, and
one of the pair of third connection portions is connected to one of the pair of the first connection portions and one of the pair of the second connection portions and the other of the pair of third connection portions is connected to the other of the pair of the first connection portions and the other of the pair of the second connection portions.

15. The actuator device according to claim 14,
wherein when viewed in the direction orthogonal to the first and second axes, each of the pair of the third connection portions extends in a direction inclined with respect to the first and second axes.

16. The actuator device according to claim 1,
wherein the first movable part includes a body portion, a ring shape portion, and a pair of connecting portions, and
when viewed in the direction orthogonal to the first and second axes, the ring shape portion is formed to surround the body portion with a gap therebetween and the body portion and the ring shape portion is connected to each other by the pair of connecting portions.

17. The actuator device according to claim 16,
wherein the pair of connecting portions are connected to the body portion on both sides in the second axis direction.

\* \* \* \* \*